US008555148B2

(12) United States Patent
Pi et al.

(10) Patent No.: US 8,555,148 B2
(45) Date of Patent: Oct. 8, 2013

(54) METHODS AND APPARATUS TO GENERATE MULTIPLE CRCS

(75) Inventors: Zhouyue Pi, Richardson, TX (US);
Farooq Khan, Allen, TX (US);
Jianzhong Zhang, Irving, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 1034 days.

(21) Appl. No.: 12/213,579

(22) Filed: Jun. 20, 2008

(65) Prior Publication Data
US 2009/0077456 A1    Mar. 19, 2009

Related U.S. Application Data

(60) Provisional application No. 60/960,161, filed on Sep. 18, 2007.

(51) Int. Cl.
*H03M 13/00* (2006.01)

(52) U.S. Cl.
USPC ............................................ 714/781; 714/755

(58) Field of Classification Search
USPC ................. 714/758, 776, 781, 807, 801, 804, 714/755, 786, 805
See application file for complete search history.

(56) References Cited

U.S. PATENT DOCUMENTS

| 6,598,202 | B1 * | 7/2003 | Kim et al. | 714/786 |
| 6,697,986 | B2 | 2/2004 | Kim et al. | |
| 7,152,198 | B2 * | 12/2006 | Kajita | 714/758 |
| 7,302,620 | B2 | 11/2007 | Kim | |
| 7,793,194 | B2 * | 9/2010 | Seo et al. | 714/776 |
| 7,853,857 | B2 * | 12/2010 | Buckley et al. | 714/781 |
| 8,074,150 | B2 * | 12/2011 | Buckley et al. | 714/781 |

(Continued)

FOREIGN PATENT DOCUMENTS

| EP | 1 298 829 A1 | 4/2003 |
| JP | 2002 532940 | 10/2002 |

(Continued)

OTHER PUBLICATIONS

Notification of Transmittal of the International Search Report and the Written Opinion of the International Searching Authority, or the Declaration dated Feb. 20, 2009 in connection with PCT Application No. PCT/KR2008/005412.

(Continued)

Primary Examiner — David Ton

(57) ABSTRACT

Methods and apparatus for generating cyclic redundancy checks (CRCs). In one aspect of the present invention, a plurality of cyclic redundancy checks are calculated based upon a plurality of bits by using a selected cyclic redundancy check generator polynomial, at least one cyclic redundancy check is calculated based upon a first subset of the plurality of bits with a certain bit ordering, and at least another cyclic redundancy check is calculated based upon a second subset of the plurality of bits with a different bit ordering. The second subset of bits may overlap with the first subset of bits. In another aspect, a plurality of cyclic redundancy checks are calculated based upon a plurality of bits by using a plurality of different cyclic redundancy check generator polynomials. A first cyclic redundancy check generator polynomial is used for calculating a first cyclic redundancy check based upon a first plurality of bits, and a second cyclic redundancy check generator polynomial is used for calculating a second cyclic redundancy check based upon a second plurality of bits.

27 Claims, 7 Drawing Sheets

(56) References Cited

U.S. PATENT DOCUMENTS

| | | |
|---|---|---|
| 8,265,768 B2 | 9/2012 | Klostermann et al. |
| 2004/0268206 A1 | 12/2004 | Kim et al. |
| 2005/0094603 A1 | 5/2005 | Kim et al. |
| 2007/0118786 A1 | 5/2007 | Lim et al. |
| 2008/0192705 A1 | 8/2008 | Suzuki |
| 2009/0077446 A1* | 3/2009 | Seo et al. ............... 714/755 |
| 2010/0287441 A1* | 11/2010 | Seo et al. ............... 714/755 |
| 2011/0154154 A1* | 6/2011 | Seo et al. ............... 714/755 |
| 2012/0079359 A1 | 3/2012 | Buckley et al. |

FOREIGN PATENT DOCUMENTS

| | | |
|---|---|---|
| JP | 2010 539797 | 12/2010 |
| KR | 1020050041344 A | 5/2005 |
| RU | 2005137244 A | 6/2007 |
| RU | 2352073 C2 | 4/2009 |
| WO | WO 2006 114855 | 11/2006 |

OTHER PUBLICATIONS

European Search Report dated May 8, 2009 in connection with European Patent Application No. EP 08 16 4407.

"Way forward for CRC attachment for turbo-coded transport channels", 3GPP TSG-RAN Working Group 1 #50, Athens, Greece, Aug. 20-24, 2007, 1 page.

"Error Detection Reliability of CRC", TSG-RAN WG1 #50bis, Shanghai, China, Oct. 8-12, 2007, 7 pages.

"Summary of the E-mail discussion on channel coding" R1-072927; 3GPP TSG RSN WG1 #49bis, Jun. 25-29, 2007; 4 pages.

ETSI, "Universal Mobile Telecommunications Systems (UMTS); UTRA (UE) TDD; Radio Transmission and reception", (3GPPTS 25.102 VERSION 5.3.0 Release 5), Dec. 2002, 87 pages.

Qualcomm Europe, "CRC for Multiple Code Block Transimssions", 3GPP TSG-RAN WG1 #50, Aug. 20-24, 2007, Athens, Greece, 3 pages.

* cited by examiner

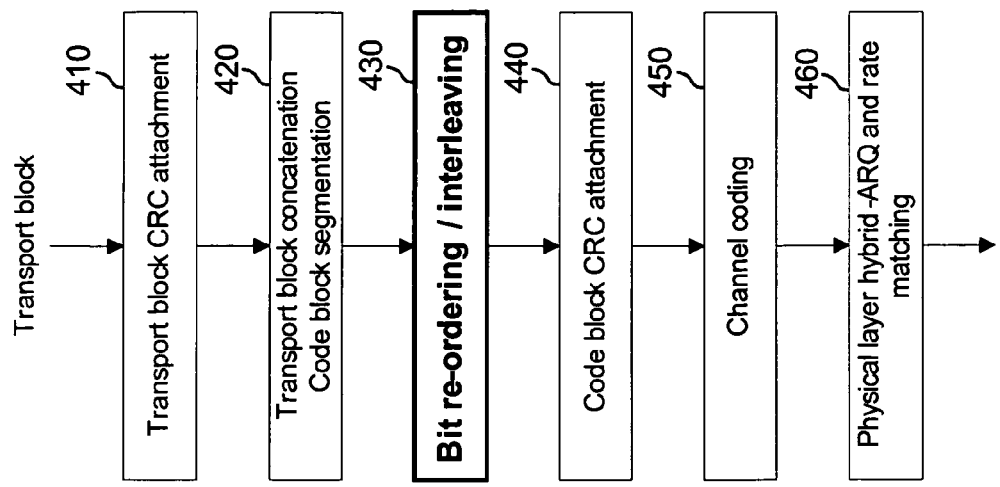
FIG. 3(c)
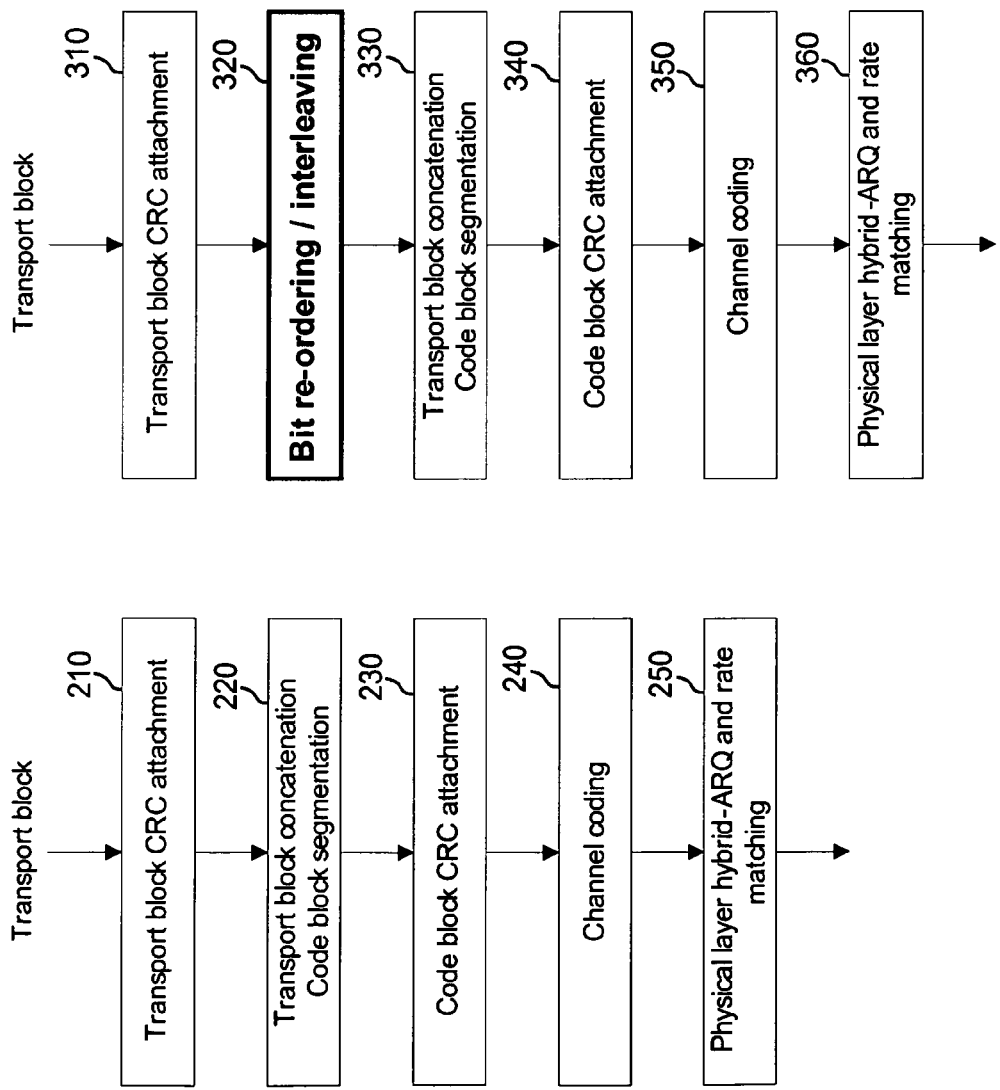
FIG. 3(b)
FIG. 3(a)

METHODS AND APPARATUS TO GENERATE MULTIPLE CRCS

CLAIM OF PRIORITY

This application makes reference to, incorporates the same herein, and claims all benefits accruing under 35 U.S.C. §119 from a provisional application earlier filed in the U.S. Patent & Trademark Office on 18 Sep. 2007 and there duly assigned Ser. No. 60/960,161.

BACKGROUND OF THE INVENTION

1. Field of the Invention

The present invention relates to methods and apparatus for generating multiple cyclic redundancy checks (CRCs).

2. Description of the Related Art

A wireless communication system generally includes multiple base stations and multiple mobile stations, while a single base station often communicates with a set of mobile stations. The transmission from a base station to a mobile station is known as downlink communication. Likewise, the transmission from a mobile station to a base station is known as uplink communication. Both base stations and mobile stations may employ multiple antennas for transmitting and receiving radio wave signals. The radio wave signal may be either Orthogonal Frequency Division Multiplexing (OFDM) signals or Code Division Multiple Access (CDMA) signals. A mobile station may be either a PDA, laptop, or handheld device.

In a third Generation Partnership Project long term evolution (3GPP LTE) system, when a transport block is large, the transport block is segmented into multiple code blocks so that multiple coded packets can be generated, which is advantageous because of benefits such as enabling parallel processing or pipelining implementation and flexible trade off between power consumption and hardware complexity.

In a contemporary High Speed Data Shared Channel (HS-DSCH) design, only one 24-bit cyclic redundancy check (CRC) is generated for the whole transport block for the purpose of error detection for that block. If multiple code blocks are generated and transmitted in one transmission time interval (TTI), the receiver may correctly decode some of the code blocks but not the others. In that case, the receiver will feed back a non-acknowledgement (NAK) to the transmitter because the CRC for the transport block will not check.

SUMMARY OF THE INVENTION

It is therefore an object of the present invention to provide improved methods and apparatus for generating cyclic redundancy checks for multiple code blocks.

It is another object of the present invention to provide an improved method and apparatus for error detection.

According to one aspect of the present invention, a plurality of cyclic redundancy checks are calculated based upon a plurality of bits. At least one cyclic redundancy check is calculated based upon a subset of the plurality of bits. The plurality of cyclic redundancy checks and the plurality of bits are then transmitted via at least one transmission antenna.

According to another aspect of the present invention, a transport block cyclic redundancy check is calculated based upon a transport block of information bits by using a selected cyclic redundancy check generator polynomial. The transport block is segmented into at least one code block. Then, at least one code block cyclic redundancy check is calculated based upon the at least one code block by using the selected cyclic redundancy check generator polynomial, with one code block cyclic redundancy check being calculated based upon one corresponding code block. Finally, the at least one code block and the at least one code block cyclic redundancy check are transmitted via at least one transmission antenna. In this method, the information bits in the transport block are interleaved after the transport block cyclic redundancy check is calculated and before the at least one code block cyclic redundancy check is calculated.

The information bits in the transport block may be interleaved together with the bits in the transport block cyclic redundancy check.

Alternatively, the information bits in the transport block may be interleaved without the bits in the transport block cyclic redundancy check.

The information bits in the transport block may be interleaved before the segmentation of the transport block into the at least one code block.

Alternatively, the information bits in the transport block may be interleaved after the segmentation of the transport block into the at least one code block.

The information bits in the transport block may be interleaved by applying interleaving patterns that have smaller span than the length of a code block.

The information bits in the transport block may be interleaved by switching at least one information bit with another information bit in the transport block.

According to yet another aspect of the present invention, a transport block cyclic redundancy check is calculated based upon a sequence of information bits in a transport block by using a selected cyclic redundancy check generator polynomial. The transport block is then segmented into at least one code block. At least one code block cyclic redundancy check is calculated based upon the at least one code block by using the selected cyclic redundancy check generator polynomial, with one code block cyclic redundancy check being calculated based upon one corresponding code block. Finally, the at least one code block and the at least one code block cyclic redundancy check are transmitted via at least one antenna. In this method, with one of the bit sequence in the transport block and the bit sequence in the at least one code block is reversely ordered before the respective corresponding cyclic redundancy check being calculated.

Specifically, the transport block cyclic redundancy check may be calculated based upon a natural order of the bit sequence in the transport block, and the code block cyclic redundancy check may be calculated based upon a reverse order of the bit sequence in the code block.

Alternatively, the transport block cyclic redundancy check may be calculated based upon a reverse order of the bit sequence in the transport block, and the code block cyclic redundancy check may be calculated based upon a natural order of the bit sequence in the code block.

According to still another aspect of the present invention, a transport block cyclic redundancy check is calculated based upon a transport block of information bits by using a selected cyclic redundancy check generator polynomial. The transport block is segmented into a plurality of code blocks. The bits in the transport block cyclic redundancy check are spread into each of the code blocks. Then, a plurality of code block cyclic redundancy checks are calculated based upon the plurality of code blocks by using the selected cyclic redundancy check generator polynomial, with each code block cyclic redundancy check being calculated based upon a corresponding code block. Finally, the plurality of code blocks and the plurality of code block cyclic redundancy checks are transmitted via at least one antenna.

According to still yet another aspect of the present invention, at least one code block of bit sequence and at least one code block cyclic redundancy check are received via at least one antenna. The at least one code block is decoded. The at least one code block cyclic redundancy check is checked by using a selected cyclic redundancy check generator polynomial to determine whether the at least one code block is correctly decoded. If the at least one code block is correctly decoded, the at least one code block is concatenated to generate a transport block. A transport block cyclic redundancy check of the transport block is checked by using the selected cyclic redundancy check generator polynomial to determine whether the transport block is correctly decoded. In this method, the bit sequence in one of the at least one code block and the transport block is re-ordered after the at least one code block cyclic redundancy check is checked and before the transport block cyclic redundancy check is checked.

According to a further aspect of the present invention, a plurality of cyclic redundancy checks are calculated based upon a plurality of bits by using a plurality of cyclic redundancy check generator polynomials. In this method, a first cyclic redundancy check generator polynomial is used for calculating a first cyclic redundancy check based upon a first plurality of bits, and a second cyclic redundancy check generator polynomial is used for calculating a second cyclic redundancy check based upon a second plurality of bits.

The first plurality of bits may be a subset of the second plurality of bits.

Alternatively, the first plurality of bits may be a superset of the second plurality of bits.

Still alternatively, the first plurality of bits may overlap the second plurality of bits.

The first cyclic redundancy check and the second cyclic redundancy check may have different lengths.

Alternatively, the first cyclic redundancy check and the second cyclic redundancy check may have the same length.

According to a still further aspect of the present invention, a transport block cyclic redundancy check is calculated based upon a transport block of information bits by using a first cyclic redundancy check generator polynomial. The transport block is segmented into at least one code block. Then, at least one code block cyclic redundancy check is calculated based upon the at least one code block by using a second cyclic redundancy check generator polynomial, with one code block cyclic redundancy check being calculated based upon one corresponding code block. Finally, the at least one code block and the at least one code block cyclic redundancy check are transmitted via at least one antenna.

According to still another aspect of the present invention, at least one code block of bit sequence and at least one code block cyclic redundancy check are received via at least one antenna. The at least one code block is decoded. Then, the at least one code block cyclic redundancy check is checked by using a second cyclic redundancy check generator polynomial to determine whether the at least one code block is correctly decoded. If the at least one code block is correctly decoded, the at least one code block is concatenated to generate a transport block. Finally, a transport block cyclic redundancy check of the transport block is checked by using a first cyclic redundancy check generator polynomial to determine whether the transport block is correctly decoded.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3(a) schematically illustrates a transmitter operation for calculating transport block CRC and code block CRC;

FIG. 3(b) schematically illustrates a transmitter operation for calculating transport block CRC and code block CRC as one embodiment according to the principles of the present invention;

FIG. 3(c) schematically illustrates a transmitter operation for calculating transport block CRC and code block CRC as another embodiment according to the principles of the present invention;

DETAILED DESCRIPTION OF THE INVENTION

Figure 1:
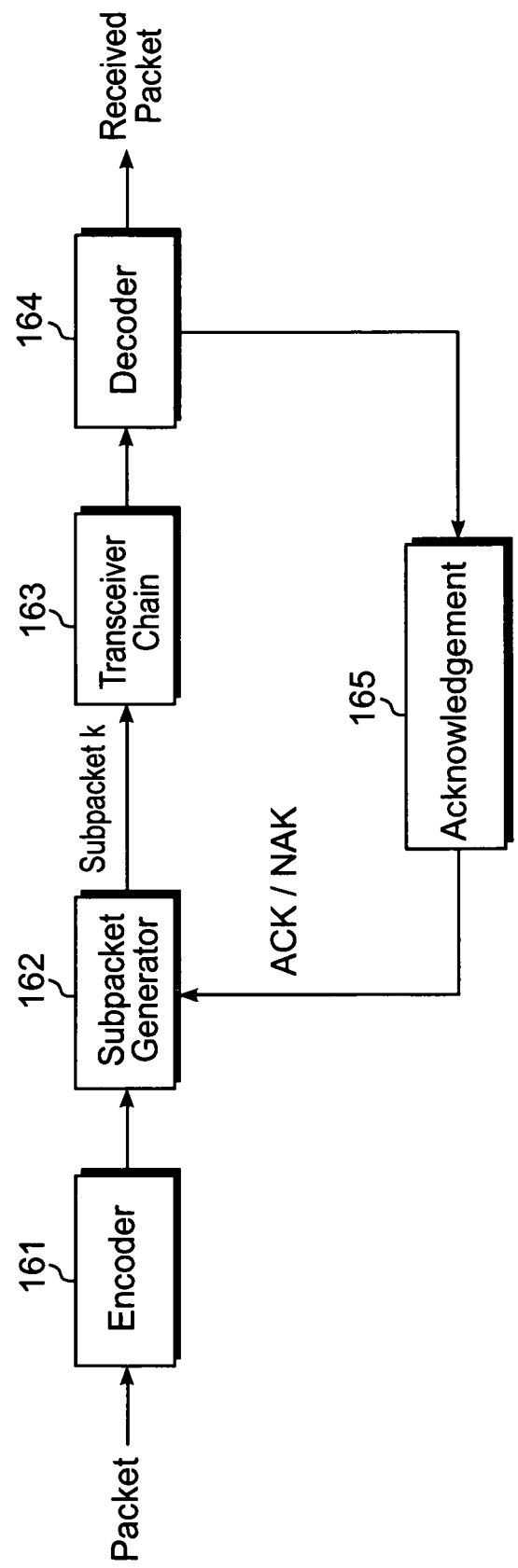
FIG. 1 schematically illustrates an operation of a Hybrid Automatic Repeat reQuestion (HARQ) system.

Hybrid Automatic Repeat reQuestion (HARQ) is widely used in communication systems to combat decoding failure and improve reliability. As shown in FIG. 1, each data packet is coded using certain forward error correction (FEC) scheme to generate multiple subpackets. Each subpacket may only contain a portion of the coded bits. If the transmission for subpacket k fails, as indicated by a non-acknowledgement (NAK) messamge in a feedback acknowledgement channel, a retransmission subpacket, subpacket k+1, is transmitted to help the receiver decode the packet. The retransmission subpackets may contain different coded bits than the previous subpackets. The receiver may softly combine or jointly decode all the received subpackets to improve the chance of decoding. Normally, a maximum number of transmissions is configured in consideration of both reliability, packet delay, and implementation complexity.

Figure 2:
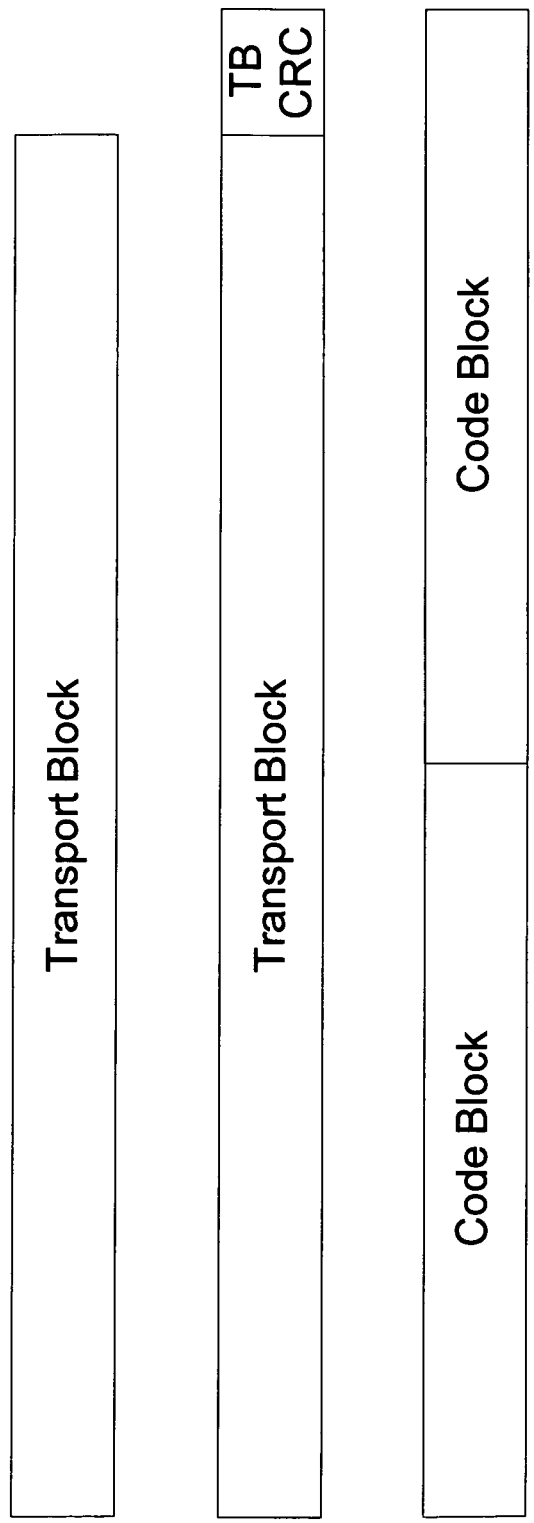
FIG. 2 schematically illustrates an example of transport block cyclic redundancy check (CRC) and code block segmentation.

In a 3rd Generation Partnership Project (3GPP) Long Term Evolution (LTE) system, when a transport block is large, the transport block is segmented into multiple code blocks so that multiple coded packets can be generated, which is advantageous because of benefits such as enabling parallel processing or pipelining implementation and flexible trade off between power consumption and hardware complexity. In the current HS-DSCH design, only one 24-bit cyclic redundancy check (CRC) is generated for the whole transport block for the purpose of error detection for that block. If multiple code blocks are generated and transmitted in one transmission time interval (TTI), the receiver may correctly decode some of the code blocks but not the others. In that case, the receiver will feedback a non-acknowledgement (NAK) to the transmitter because the CRC for the transport block will not check. The relationship of transport block, transport block CRC (TB CRC), and code block segmentation is shown in FIG. 2.

Assume we use an L-bit CRC polynomial to generate a CRC. Denote the CRC generation polynomial by $$g(x)=g_0 x^L + g_1 x^{L-1} + \ldots + g_{L-1} x + g_L. \quad (1)$$

In general, for a message:

$$m(x) = m_0 x^{M-1} + m_1 x^{M-2} + \ldots + m_{M-2} x + m_{M-1}, \quad (2)$$

the CRC encoding is performed in a systematic form. Denote the CRC parity bits of the message as $p_0, p_1, \ldots, p_{L-1}$, which can also be represented as a polynomial of:

$$p(x) = p_0 x^{L-1} + p_1 x^{L-2} + \ldots + p_{L-2} x + p_{L-1}. \quad (3)$$

The CRC $p(x)$ can be calculated by shifting the message by L bit, and then dividing the resulted sequence by the generator polynomial $g(x)$. The remainder is the CRC of the message $m(x)$. In a mathematical form, $$p(x) = m(x) \cdot x^L - q(x) \cdot g(x), \quad (4)$$

where $q(x)$ is the quotient of dividing $m(x) \cdot x^L$ by $g(x)$. Rearranging the terms of the equation above, the polynomial, $$m(x) \cdot x^L - p(x) = m_0 x^{M+L-1} + m_1 x^{M+L-2} + \ldots + m_{M-2} x^{L+1} + m_{M-1} x^L + p_0 x^{L-1} + p_1 x^{L-2} + \ldots + p_{L-2} x + p_{L-1} \quad (5)$$

yields a remainder equal to 0 when divided by $g(x)$.

Note that if the each bit in the message is binary, the message can be represented as a polynomial defined on binary Galois field (GF(2)). In that case, the operation of '+' and '−' is the same. In other words, if the message bits are binary, the message with CRC attached can be represented by either $m(x) \cdot x^L + p(x)$ or $m(x) \cdot x^L - p(x)$. In the rest of this invention, we assume the message bits are binary for the sake of convenience. The ideas disclosed in this invention, however, certainly apply when the message bits are non-binary.

In this invention, we propose methods and apparatus to compute multiple CRCs for a transmission to improve the reliability of the transmission and reduce the transmitter and receiver complexity.

Aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive. The invention is illustrated by way of example, and not by way of limitation, in the figures of the accompanying drawings. In the following illustrations, we use data channel in LTE systems as an example. The technique illustrated here, however, can certainly be used in other channel in LTE systems, and other data, control, or other channels in other systems whenever applicable.

We first illustrate the concept of transport block, code block, transport block Cyclic Redundancy Check (CRC), and code block CRC. A portion of the encoding processing chain with transport block CRC but no code block CRC is shown in FIG. 3(*a*). A transport block consists of a stream of bits. A transport block CRC is calculated and attached to the bit stream (step 210). Multiple transport blocks in a transmission time interval (TTI) can be serially concatenated (step 220), if necessary. If the size of a transport block (or the concatenated transport blocks) is larger than Z (the maximum size of a code block in question), code block segmentation is performed for the transport block (or the concatenated transport blocks) (step 220). An example of the resulted code blocks is shown in FIG. 2. Code block CRC is calculated and attached to each of the code blocks (step 230). Then, channel coding (step 240) and physical layer hybrid-ARQ and rate matching (step 250) are performed before the code blocks are transmitted.

A portion of the encoding processing chain with transport block CRC and code block CRC is shown in FIG. 3(*b*). A transport block CRC is calculated and attached to the bit stream (step 310). The bits in the transport block are interleaved (step 320). Multiple transport blocks in a transmission time interval (TTI) are serially concatenated (step 330), and code block segmentation is performed for the transport block (or the concatenated transport blocks) (step 330). Code block CRC is calculated and attached to each of the code blocks (step 340). Then, channel coding (step 350) and physical layer hybrid-ARQ and rate matching (step 360) are performed before the code blocks are transmitted.

In another example as shown in FIG. 3(*c*), a transport block CRC is calculated and attached to the bit stream (step 410). Multiple transport blocks in a transmission time interval (TTI) are serially concatenated (step 420), and code block segmentation is performed for the transport block (or the concatenated transport blocks) (step 420). The bits in the transport block are interleaved (step 430). Code block CRC is calculated and attached to each of the code blocks (step 440). Then, channel coding (step 450) and physical layer hybrid-ARQ and rate matching (step 460) are performed before the code blocks are transmitted.

Note that, however, in the following embodiments described in this invention, the transport blocks may or may not contain transport block CRC before the transport block concatenation or code block segmentation. After the code block segmentation, CRC can be generated for some, or all, of the code blocks. For illustration purpose, let's assume a code block CRC is generated for every code block, although the ideas disclosed in this invention certainly apply otherwise. For ease of illustration, we assume there is only one transport block. All of the embodiments in this invention, however, apply to cases with multiple transport blocks and transport block concatenation. Also note that all the embodiments in this invention apply to CRC computation at both the transmitter and the receiver.

Figure 4:
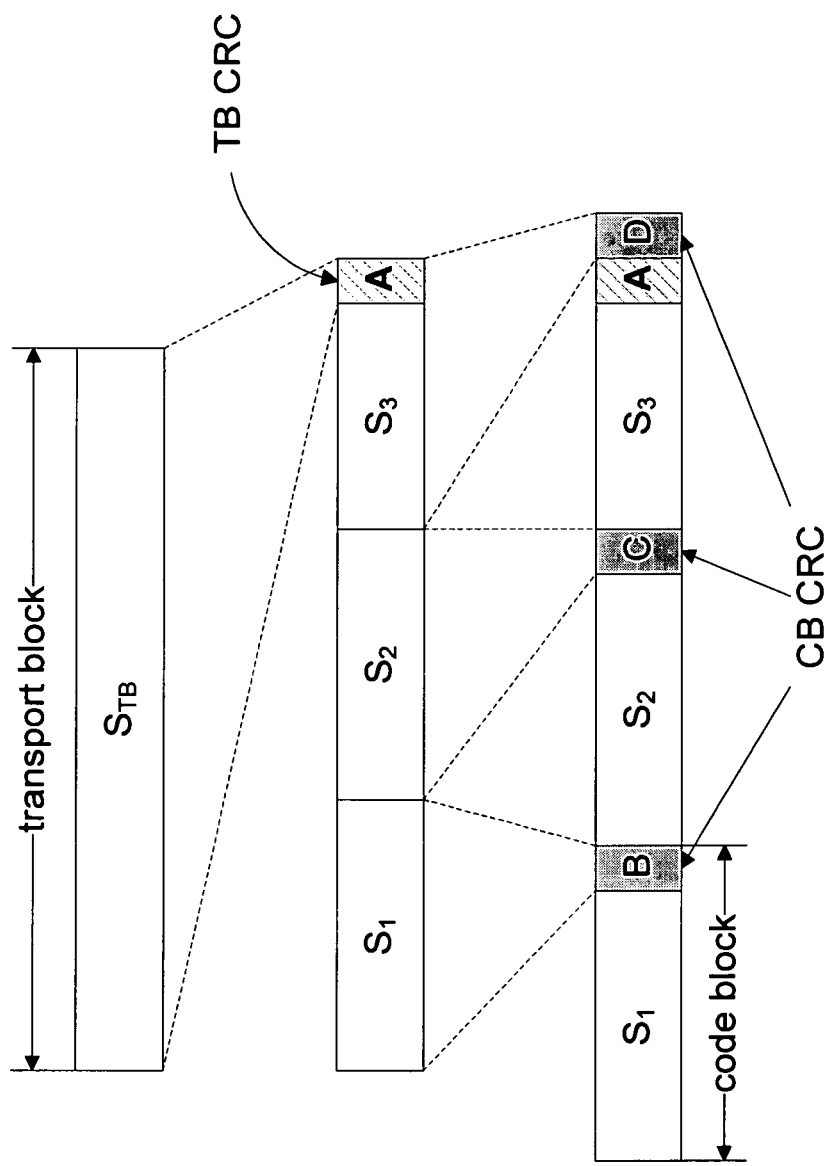
FIG. 4 schematically illustrates an example of transport block CRC and code block CRC as one embodiment according to the principles of the present invention.

In FIG. 4, we show an example of attaching both transport block CRC (TB CRC) and code block CRC (CB CRC). CB CRC can be used to check whether a code block is decoded correctly and to stop further turbo decoding iterations by a turbo decoder if the CB CRC checks. Without CB CRC, the turbo decoder may run for the maximum number of iterations for each code block. Assuming a pipeline implementation of the receiver for multiple code blocks, the code blocks are decoded in a serial manner. In the case there is only one acknowledgement channel for a transport block, the transport block will not be acknowledged (i.e., will be NAKed) as long as one code block is in error. If the CRC fails for a code block after the maximum number of iterations, the receiver can skip decoding of the rest of the code blocks and send a negative acknowledgement. Without CB CRC, the receiver may continue to decode the other code blocks although one code block is already in error. After decoding all code blocks, the receiver may check the TB CRC, only to find out that the transport block is in error. Therefore, the introduction of CB CRC can reduce the unnecessary turbo decoding iterations at the receiver, resulting in power savings and complexity reduction. On the other hand, each time the CB CRC is applied, it introduces a probability of CRC miss detection, which could lead to stop the decoding iterations when the code block has not been correctly decoded. Moreover, this error could not be detected without the transport block CRC (TB CRC). Note this undetected error has severe impact to the communication because the error will propagate to higher layers of the communication protocol and trigger higher layer retransmissions, reducing the overall quality of the communication channel and user experience. Therefore, TB CRC is used to guarantee a low CRC miss detection rate for the whole transport block.

In a first embodiment according to the principles of the invention, a first ordering of a plurality of bits is used in calculating a first CRC while a second ordering of the plurality of bits is used in calculating a second CRC. In the example as shown in FIG. 4, the same CRC generator polynomial may be used for generating both the TB CRC and the CB CRC for ease of implementation. In that case, if the same ordering, or bit sequence, is used to generate TB CRC and CB CRC, an error sequence that results in a mis-detection in CB CRC may also result in a miss detection in TB CRC. In order to avoid that, the bits are reordered after the TB CRC is generated and before the CB CRC is generated. Note that the bit re-ordering/interleaving may be only applied to a portion of the information bits or the bits of the TB CRC. For example, the bit re-ordering/interleaving can be applied to only the information bits but not to the bits of the TB CRC. Alternatively, the bit re-ordering/interleaving can be applied to both the information bits and the bits of the TB CRC.

FIG. 3(b) and FIG. 3(c) show two examples of how the bit re-ordering/interleaving can be done in the transmitter processing chain. In FIG. 3(b), the bit stream of the transport block is interleaved/re-ordered before the code block segmentation; whereas in FIG. 3(c), the interleaving/re-ordering is applied for each code block after the code block segmentation. The re-ordering/interleaving on the whole transport block level, as shown in FIG. 3(b) may introduce a delay as long as the processing time for the whole transport block; the re-ordering/interleaving on the code block level, as shown in FIG. 3(c), may introduce a delay as long as the processing time of a code block.

Similarly, re-ordering/interleaving patterns that have smaller span than a code block can also be used to further reduce the interleaving delay. For example, a simple re-ordering pattern could be to switch at least one bit with another bit in the stream. Note this re-ordering pattern only introduces interleaving delay of as little as one bit, if the two bits are adjacent. Certainly, the switching operation can be applied to more than one bit in the stream. In fact, this operation could be applied to all the bits in the stream. One example could be to switch the even-numbered bits with the odd-numbered bits. Again, bit re-ordering/interleaving may be only applied to a portion, or all, of the information bits but not to the bits of the TB CRC. Alternatively, the bit re-ordering/interleaving can be applied to both the information bits and the bits of the TB CRC.

Alternatively, we can calculate the TB CRC with the natural order of the bit sequence and calculate the CB CRC with the reverse order of the bit sequence. The reverse ordering may be applied before the segmentation of the transport block. Alternatively, the reverse ordering may be applied after the segmentation of the transport block. Or we can calculate the TB CRC with the reverse order of the bit sequence and calculate the CB CRC with the natural order of the bit sequence. Yet again, bit reversal ordering may be only applied to the information bits but not to the bits of the TB CRC. Alternatively, the bit reversal ordering can be applied to both the information bits and the bits of the TB CRC. Note that the CB CRC is calculated based upon the reverse order of the bit sequence within the corresponding code block. Also note that the bit reversal ordering that is applied to the information bits with or without the bits of the TB CRC is only applicable for the case that CB CRC is calculated based upon the reversal ordering of bit sequence.

Yet as another alternative, the bit re-ordering/interleaving can be achieved as part of concatenation/segmentation block. As an example, if we need to segment the transport block, together with the transport block CRC, into multiple code blocks, we can spread the bits of the transport block CRC into each code block. This is effectively an interleaver but may be simpler to argue this way because we are not creating an additional block in the coding chain.

Figure 5C:
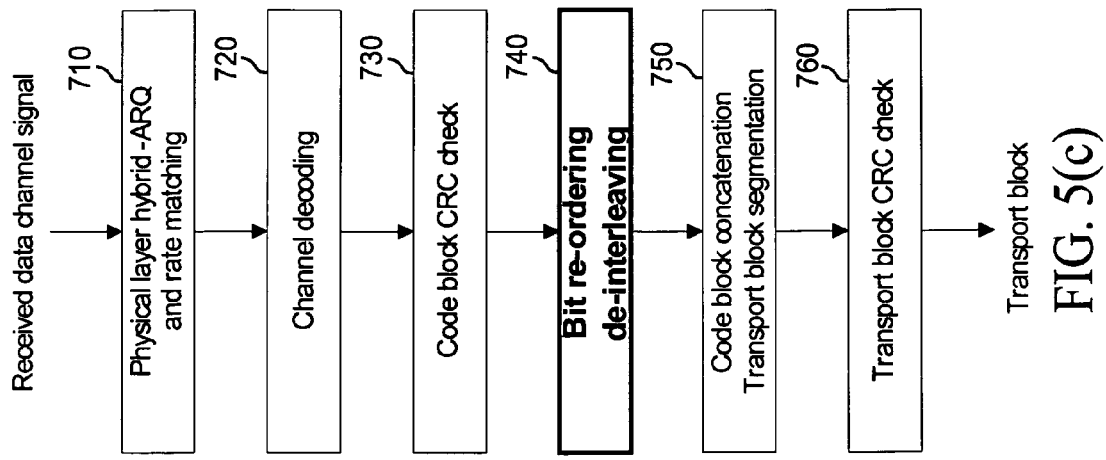
FIG. 5(c) schematically illustrates a receiver operation for calculating code block CRC and transport block CRC as another embodiment according to the principles of the present invention.
Figure 5B:
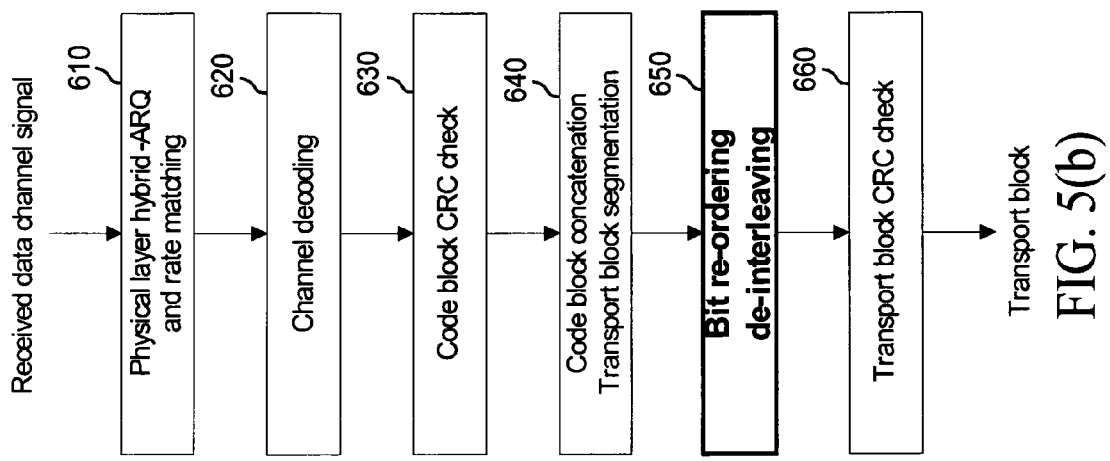
FIG. 5(b) schematically illustrates a receiver operation for calculating code block CRC and transport block CRC as one embodiment according to the principles of the present invention.
Figure 5A:
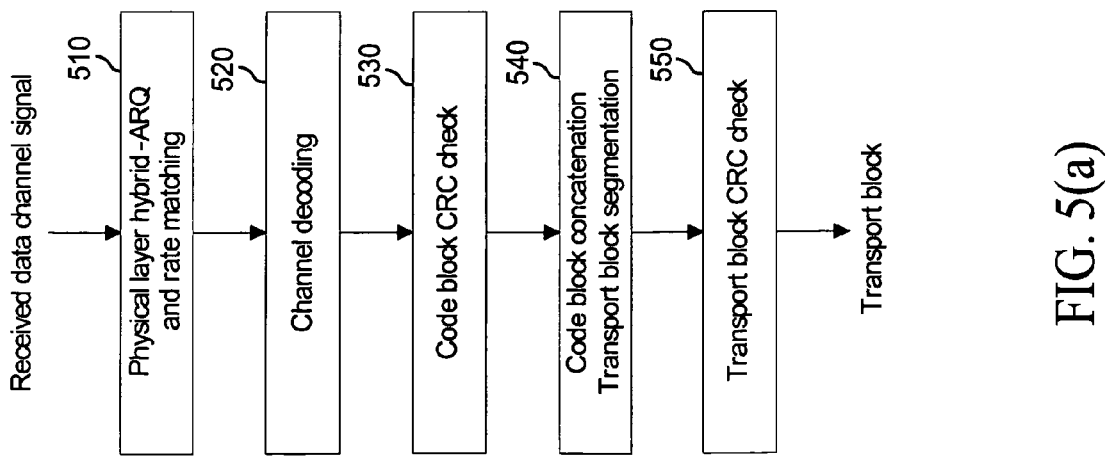
FIG. 5(a) schematically illustrates a receiver operation for calculating code block CRC and transport block CRC.

FIGS. 5(a) through (c) show examples of how the receiver re-orders/interleaves the bit stream between the CB CRC calculation and the TB CRC calculation. FIG. 5(a) shows part of the receiver processing, assuming no bit re-ordering/interleaving between performing CB CRC check and TB CRC check. Specifically, in FIG. 5(a), when data channel signal is received by a wireless terminal (i.e., a base station or a unit of user equipment), physical layer hybrid-ARQ and rate matching is first performed (step 510). Then, the code blocks of the data channel signal are decoded (step 520). The code block CRCs are checked to see whether the code blocks are correctly decoded (step 530). Then the code blocks are concatenated into a transport block (step 540). The transport block CRC is checked to see whether the transport block is correctly decoded. If the bit re-ordering/interleaving is applied at the transmitter side, such as shown in FIGS. 3(b) and (c), the receiver will re-order/de-interleave the bits accordingly, as shown in FIGS. 5(b) and (c), respectively. In FIG. 5(b), the bit stream of the transport block is re-ordered/de-interleaved (step 650) after the code block concatenation (step 640); whereas in FIG. 5(c), the re-ordering/de-interleaving happens for each code block (step 740) before the code block concatenation (step 750). The re-ordering/interleaving on the whole transport block level, as shown in FIG. 5(b) may introduce a delay as long as the processing time for the whole transport block; the re-ordering/interleaving on the code block level, as shown in FIG. 5(c), may introduce a delay as long as the processing time of a code block.

Obviously, many variations can be obtained by combining the aforementioned embodiments in different ways without departing from the spirit of the invention.

In a second embodiment according to the principles of the present invention, a first CRC generator polynomial is used in calculating a first CRC based on a first plurality of bits while a second CRC generator polynomial that is different from the first CRC generator polynomial is used in calculating a second CRC based on a second plurality of bits. Again, FIG. 4 is used as an example. There is one transport block CRC, namely, CRC "A". A CRC generator polynomial, $g_1(x)$, is used in calculating CRC "A" based on all the information bits in the transport block, which is denoted as bit stream $S_{TB}$ as shown in the figure, $S_{TB}=S_1 \cup S_2 \cup S_3$. There are three code block CRCS, namely CRC "B", CRC "C", and CRC "D", respectively. A second CRC generator polynomial, $g_2(x)$, which is different from $g_1(x)$, is used in calculating code block CRC "B", "C", and "D". CRC "B" is calculated based on the information bits in the first code block, which is denoted as bit stream $S_1$ as shown in the figure; CRC "C" is calculated based on the information bits in the second code block, which is denoted as bit stream $S_2$ as shown in the figure; CRC "D" is calculated based on the information bits in the third code block, which in denoted as bit stream $S_3$ as shown in the figure, and the transport block CRC "A". Denote the bit stream obtained by concatenating $S_3$ and "A" as $S_4$, i.e., $S_4 = S_3 \cup$ "A". In other words, CRC "D" is calculated based on bit stream $S_4$.

In this embodiment, the first plurality of bits may be a subset of the second plurality of bits. For example, $g_2(x)$ is used in calculating CRC "B" based on $S_1$ while $g_1(x)$ is used in calculating CRC "A" based on $S_{TB}$. The bit stream $S_1$ is a subset of the bit stream $S_{TB}$.

Alternatively, the first plurality of bits may be a superset of the second plurality of bits. For example, $g_1(x)$ is used in calculating CRC "A" based on $S_{TB}$ while $g_2(x)$ is used in calculating CRC "C" based on $S_2$. The bit stream $S_{TB}$ is a superset of the bit stream $S_2$.

Still alternatively, the first plurality of bits may overlap with the second plurality of bits. For example, $g_1(x)$ is used in calculating CRC "A" based on $S_{TB}$ while $g_2(x)$ is used in calculating CRC "D" based on $S_4$. The bit stream $S_{TB}$ overlaps with the bit stream $S_4$, $S_{TB} \cap S_4 = S_3$.

The first CRC and the second CRC may have different length.

Alternatively, the first CRC and the second CRC may have the same length. For example, if both the first CRC and the second CRC are 24-bit long, the CRC generator polynomials $g_1(x)$ and $g_2(x)$ can be chosen as follows:

$$g_1(x) = x^{24} + x^{23} + x^6 + x^5 + x + 1, \text{ and}$$

$$g_2(x) = x^{24} + x^{23} + x^{14} + x^{12} + x^8 + 1. \tag{6}$$

Alternatively, the CRC generator polynomials $g_1(x)$ and $g_2(x)$ can be chosen as follows:

$$g_1(x) = x^{24} + x^{23} + x^{14} + x^{12} + x^8 + 1, \text{ and}$$

$$g_2(x) = x^{24} + x^{23} + x^6 + x^5 + x + 1. \tag{7}$$

Figure 6B:
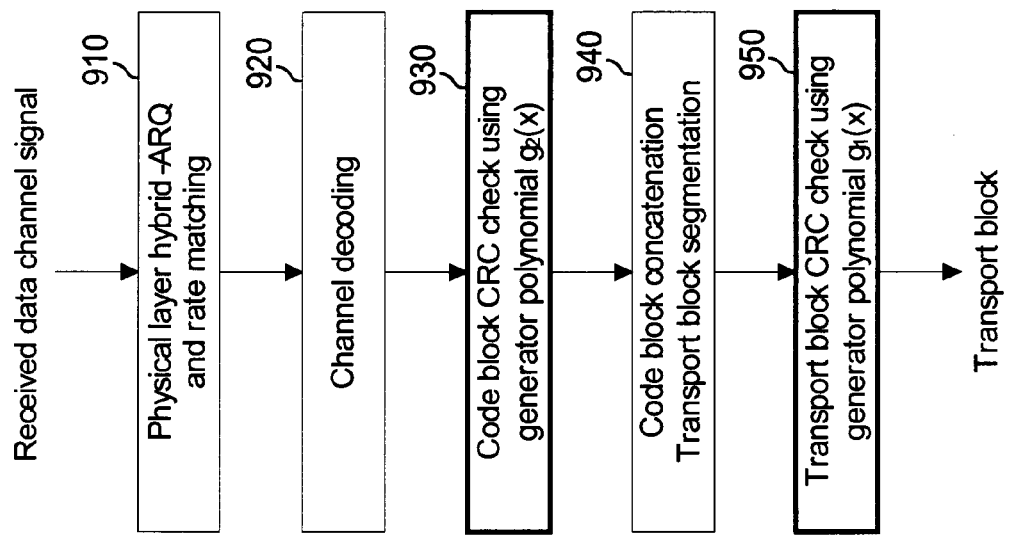
FIG. 6(b) schematically illustrates a receiver operation for calculating code block CRC and transport block CRC as still another embodiment according to the principles of the present invention.
Figure 6A:
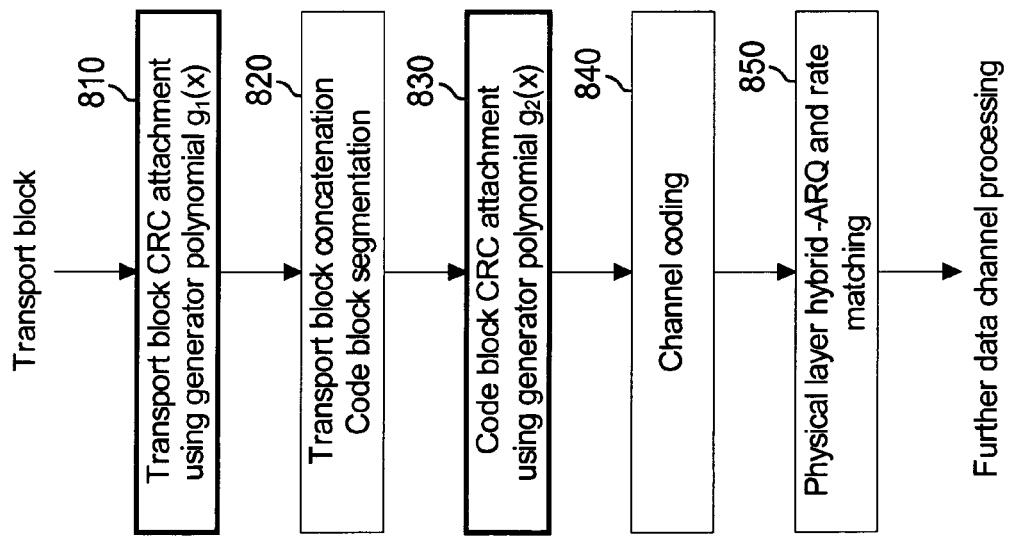
FIG. 6(a) schematically illustrates a transmitter operation for calculating transport block CRC and code block CRC as still another embodiment according to the principles of the present invention.

FIG. 6(a) shows the transmitter operation for using CRC generator polynomial $g_1(x)$ for transport block CRC calculation and CRC generator polynomial $g_2(x)$ for code block CRC calculation. FIG. 6(b) shows the corresponding receiver operation. Specifically, in a transmitter side as shown in FIG. 6(a), a transport block CRC is calculated by using the CRC generator $g_1(x)$ and is then attached to the transport block (step 810). The transport block may be segmented into a plurality of code blocks (step 820). A plurality of code block CRCs are calculated by using the CRC generator $g_2(x)$ (step 830). Then, channel coding (step 840) and physical layer hybrid-ARQ and rate matching (step 850) is performed. In a receiver side as shown in FIG. 6(b), when data channel signal is received physical layer hybrid-ARQ and rate matching is first performed (step 910). Then, the code blocks of the data channel signal are decoded (step 920). The code block CRCs are checked by the CRC generator $g_2(x)$ to see whether the code blocks are correctly decoded (step 930). Then the code blocks are concatenated into a transport block (step 940). The transport block CRC is checked by using the CRC generator $g_1(x)$ to see whether the transport block is correctly decoded (step 950).

Note, however, the ideas disclosed in this invention are not limited to the scope of calculating transport block CRCs and code block CRCs. For example, the idea of using different CRC generator polynomials to calculate different CRCs based on overlapping bit streams can be generally applied to other designs when multiple CRCs are present.

Figure 7:
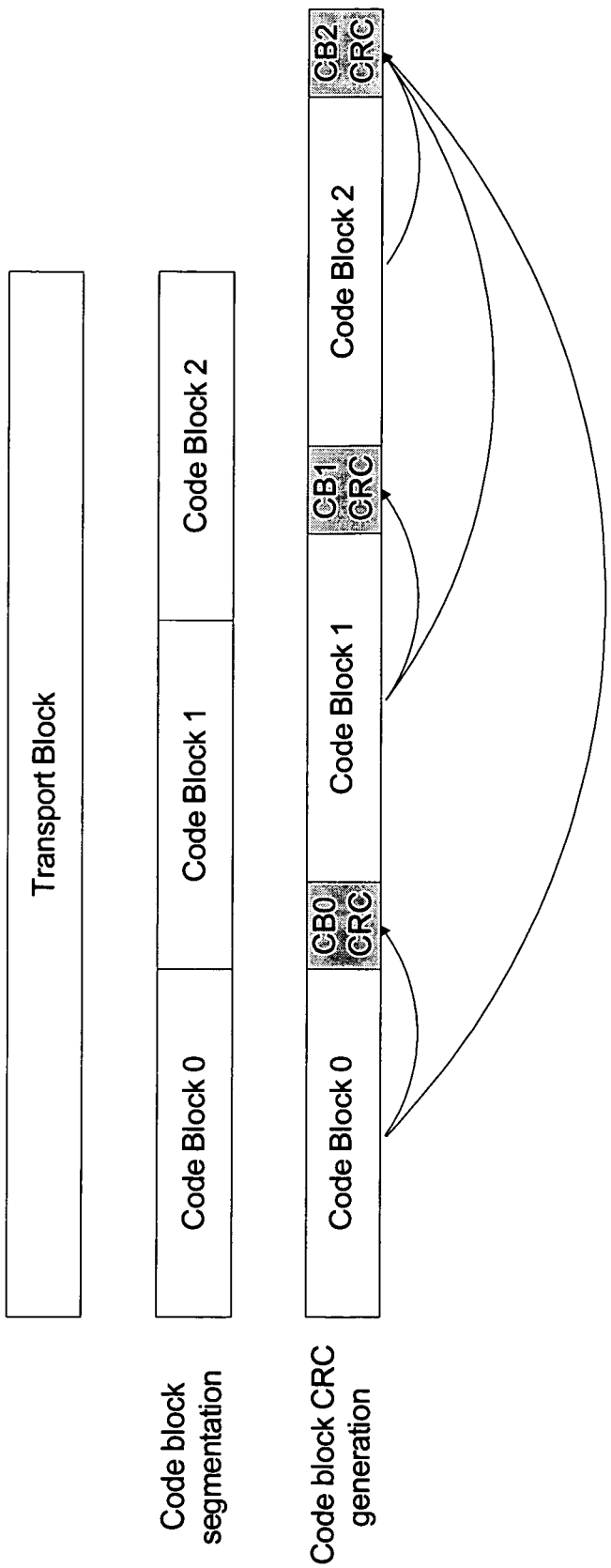
FIG. 7 schematically illustrates an example of transport block CRC and code block CRC as one embodiment according to the principles of the present invention.

For example, as shown in FIG. 7, no transport block CRC is computed before code block segmentation. The transport block is segmented into three code blocks. Code block CRC is computed for each of the three code blocks. CB0_CRC is derived from the bits in Code Block 0, using generator polynomial $g_1(x)$; CB1_CRC is derived from the bits in Code Block 1, using generator polynomial $g_1(x)$; CB2_CRC is derived from the bits in Code Block 0, Code Block 1, and Code Block 2, using generator polynomial $g_2(x)$, which is different from $g_1(x)$. The CB0_CRC can be used for stopping turbo decoding iterations or error detection for Code Block 0, the CB1_CRC can be used for stopping turbo decoding iteration or error detection for Code Block 1, the CB2_CRC can be used for stopping turbo decoding iteration and error detection for Code Block 2. At the same time, CB2_CRC provide error detection for the whole transport block.

Obviously, many variations can be obtained by combining the aforementioned embodiments in different ways without departing from the spirit of the invention.

What is claimed is:

1. A method for communication, the method comprising:
generating a transport block cyclic redundancy check of a transport block based on a first cyclic redundancy check generator polynomial;
segmenting the transport block into a plurality of code blocks when a number of bits of the transport block including the transport block cyclic redundancy check is more than a maximum code block size, wherein one of the code blocks comprises a portion of the transport block and the transport block cyclic redundancy check;
generating a plurality of code block cyclic redundancy checks of the plurality of code blocks based on a second cyclic redundancy check generator polynomial, wherein each of the code block cyclic redundancy checks is generated based upon a corresponding code block; and
transmitting at least one code block and at least one code block cyclic redundancy check.

2. The method of claim 1, wherein the transport block comprises information bits that are interleaved after the transport block cyclic redundancy check is generated and before the plurality of code block cyclic redundancy checks is generated.

3. The method of claim 2, further comprising interleaving the information bits in the transport block together with the bits in the transport block cyclic redundancy check.

4. The method of claim 2, further comprising interleaving the information bits in the transport block without interleaving the bits in the transport block cyclic redundancy check.

5. The method of claim 2, further comprising interleaving the information bits in the transport block before segmentation of the transport block into the plurality of code blocks.

6. The method of claim 2, further comprising interleaving the information bits in the transport block after segmentation of the transport block into the plurality of code blocks.

7. The method of claim 2, further comprising interleaving the information bits in the transport block by applying interleaving patterns that have a smaller span than a length of a code block.

8. The method of claim 2, further comprising interleaving the information bits in the transport block by switching at least one information bit with another information bit in the transport block.

9. The method of claim 2, further comprising interleaving the information bits in the transport block by switching the even-numbered information bits with the odd-numbered information bits in the transport block.

10. The method of claim 1, wherein one of a bit sequence in the transport block and a bit sequence in at least one code block is reversely ordered before the respective corresponding cyclic redundancy check is generated.

11. The method of claim 10, further comprising:
generating the transport block cyclic redundancy check based upon a natural order of the bit sequence in the transport block; and
generating each code block cyclic redundancy check based upon a reverse order of the bit sequence in the corresponding code block.

12. The method of claim 10, further comprising reverse ordering the bit sequence in the transport block together with the bit sequence in the transport block cyclic redundancy check before segmentation of the transport block into the plurality of code blocks.

13. The method of claim 10, further comprising reverse ordering the bit sequence in the transport block, without reverse ordering the bit sequence in the transport block cyclic redundancy check, before segmentation of the transport block into the plurality of code blocks.

14. The method of claim 10, further comprising reverse ordering the bit sequence in each code block after segmentation of the transport block into the plurality of code blocks.

15. The method of claim 10, further comprising:
generating the transport block cyclic redundancy check based upon a reverse order of the bit sequence in the transport block; and
generating each code block cyclic redundancy check based upon a natural order of the bit sequence in the corresponding code block.

16. The method of claim 1, wherein each of the plurality of code block cyclic redundancy checks is generated based on a corresponding one of the plurality of code blocks.

17. The method of claim 1, further comprising encoding at least one of the plurality of code blocks and at least one of the plurality of code block cyclic redundancy checks corresponding to one of the plurality of code blocks.

18. A method for communication, the method comprising:
receiving a code block of bit sequence and a code block cyclic redundancy check;
decoding the code block;
checking the code block cyclic redundancy check based on a second cyclic redundancy check generator polynomial to determine whether the code block is correctly decoded; and
when the code block contains a portion of a transport block, the transport block including a transport block cyclic redundancy check and having a number of bits of that is more than a maximum code block size,
concatenating two or more correctly decoded code blocks to generate the transport block, and
checking the transport block cyclic redundancy check of the transport block based on a first cyclic redundancy check generator polynomial to determine whether the transport block is correctly decoded.

19. The method of claim 18, wherein the bit sequence in one of the code block and the transport block is re-ordered after the code block cyclic redundancy check is checked and before the transport block cyclic redundancy check is checked.

20. The method of claim 19, further comprising re-ordering the bit sequence in the transport block after concatenating the two or more correctly decoded code blocks.

21. The method of claim 19, further comprising re-ordering the bit sequence in the at least one code block before concatenating the two or more correctly decoded code blocks.

22. The method of claim 18, wherein the second cyclic redundancy check generator polynomial is $g_2(x)=x^{24}+x^{23}+x^6+x^5+x+1$.

23. An apparatus in a communication system, the apparatus comprising:
a transport block generator configured to generate a transport block cyclic redundancy check of a transport block based on a first cyclic redundancy check generator polynomial;
a code block generator configured to segment the transport block into a plurality of code blocks when a number of bits of the transport block including the transport block cyclic redundancy check is more than a maximum code block size and to generate a plurality of code block cyclic redundancy checks of the plurality of code blocks based on a second cyclic redundancy check generator polynomial, wherein each of the code block cyclic redundancy checks is generated based upon a corresponding code block, wherein one of the plurality of code blocks comprises a portion of the transport block and the transport block cyclic redundancy check; and
at least one antenna configured to transmit at least one code block and at least one code block cyclic redundancy check.

24. The apparatus of claim 23, wherein the transport block comprises information bits that are interleaved after the transport block cyclic redundancy check is generated and before the plurality of code block cyclic redundancy checks is generated.

25. The apparatus of claim 23, wherein each of the plurality of code block cyclic redundancy checks is generated based on a corresponding one of the plurality of code blocks.

26. The apparatus of claim 23, wherein the code block generator is further configured to encode at least one of the plurality of code blocks and at least one of the plurality of code block cyclic redundancy checks corresponding to one of the plurality of code blocks.

27. An apparatus in a communication system, the apparatus comprising:
at least one antenna configured to receive a plurality of code blocks of bit sequence and a plurality of code block cyclic redundancy checks;
a code block decoding unit configured to decode the plurality of code blocks and to check the plurality of code block cyclic redundancy checks based on a second cyclic redundancy check generator polynomial to determine whether the plurality of code blocks is correctly decoded; and
a transport block decoding unit configured, for each code block containing a portion of a transport block, the transport block including a transport block cyclic redundancy check and having a number of bits of that is more than a maximum code block size,
to concatenate two or more correctly decoded code blocks to generate the transport block, and
to check the transport block cyclic redundancy check of the transport block based on a first cyclic redundancy check generator polynomial to determine whether the transport block is correctly decoded,
wherein one of the plurality of code blocks comprises a portion of the transport block and the transport block cyclic redundancy check.

* * * * *